United States Patent [19]

Holloway

[11] Patent Number: 4,485,372
[45] Date of Patent: Nov. 27, 1984

[54] TWO-STAGE A-TO-D CONVERTER
[75] Inventor: Peter R. Holloway, Andover, Mass.
[73] Assignee: Analog Devices, Incorporated, Norwood, Mass.
[21] Appl. No.: 310,120
[22] Filed: Oct. 9, 1981
[51] Int. Cl.³ .................. H03K 13/02; H03K 13/08; H03K 13/20
[52] U.S. Cl. .................. 340/347 AD; 324/99 D; 340/347 M; 340/347 NT
[58] Field of Search ... 340/340 M, 347 AD, 347 DA, 340/347 NT; 324/99 D

[56] References Cited
U.S. PATENT DOCUMENTS

| Re. 29,992 | 5/1979 | Wold | 340/347 NT |
|---|---|---|---|
| 3,316,547 | 4/1967 | Ammann | 340/347 NT |
| 3,646,548 | 2/1972 | Van Doren | 340/347 AD |
| 3,656,153 | 4/1972 | Takeda et al. | 340/347 AD |
| 3,997,892 | 12/1976 | Susset | 340/347 AD X |

OTHER PUBLICATIONS

The Engineering Staff of Analog Devices, Inc., Analog–Digital Conversion Handbook, 6/1972, pp. II–46 to II–51; II–80 & II–81.

Primary Examiner—T. J. Sloyan
Attorney, Agent, or Firm—Parmelee, Bollinger & Bramblett

[57] ABSTRACT

A two-stage analog-to-digital converter wherein the first stage is a resistor-string d-to-a converter controlled by a successive-approximation register, functioning in a first phase of the conversion operation to determine a set of higher order bits of the digital output signal. The second stage is a dual-slope integrating-type a-to-d converter functioning in a second phase of the conversion operation to determine the remaining lower-order bits of the digital output signal. The dual-slope converter receives a reference signal derived from two adjacent junction points of the first-stage resistor-string d-to-a converter corresponding to the higher order bits determined in the first phase of operation, thereby to assure high resolution performance.

1 Claim, 4 Drawing Figures

TWO-STAGE A-TO-D CONVERTER

BACKGROUND OF THE INVENTION

1. Field of the Invention

This invention relates to analog-to-digital converters. More particularly, this invention relates to a two-stage a-to-d converter wherein the first stage develops a set of higher-order bits of the digital output signal, and the second stage develops the remaining, lower-order bits.

2. Description of the Prior Art

With respect first to digital-to-analog converters, it has been known in the art to provide such converters having two successive stages, wherein the first stage resolves a set of higher-order bits of the input signal into a corresponding analog signal, and the second stage resolves the remaining, lower-order bits to produce a second analog signal to be added to the first analog signal. For example, Susset U.S. Pat. No. 3,997,892 shows such a converter wherein the first stage is a non-linear resistor-string d-to-a converter employing resistors of unequal values to produce a first voltage corresponding to a set of higher-order input bits, and the second stage is a linear resistor-string d-to-a converter arranged to produce a second voltage corresponding to the lower-order bits. Resistorstring converters have the desirable property of assured monotonicity, in that for each increase (decrease) in the digital input, there is a corresponding increase (decrease) in the analog output. In a two-stage digital-to-analog converter as shown by Susset, wherein the first stage is a non-linear converter, the voltage developed by that converter varies non-uniformly with uniform changes in the first stage digital input signal. Thus the voltage across the selected resistor is applied to the second stage converter so that it can develop a voltage intermediate the particular two voltages at the end terminals of the resistor selected by the first-stage digital signal.

With respect now to analog-to-digital converters, many different kinds have been in use for considerable time. In recent years, it has become important to provide such converters with extended resolution, e.g. up to sixteen or so bits, while yet assuring accurate performance. It is an object of this invention to provide such an improved analog-to-digital converter.

SUMMARY OF THE INVENTION

In a preferred embodiment of the invention, to be described hereinbelow in detail, an analog-to-digital converter is provided comprising first and second cascaded stages. The first stage includes a resistor-string d-to-a converter operated by a successive-approximation register (SAR) to develop a set of higher-order bits of the digital output signal. The second stage is a so-called dual-slope integrating converter which is so arranged as to develop the remaining lower-order bits of the digital output signal. The second stage integrator is supplied with a reference signal from the first stage analog output signal, and is arranged for cooperative operation therewith so as to assure accurate performance for high-resolution conversion.

Other objects, aspects and advantages of the invention will in part be pointed out in, and in part apparent from, the following description of a preferred embodiment considered together with the accompanying drawings.

DETAILED DESCRIPTION OF PREFERRED EMBODIMENTS

Figure 1:
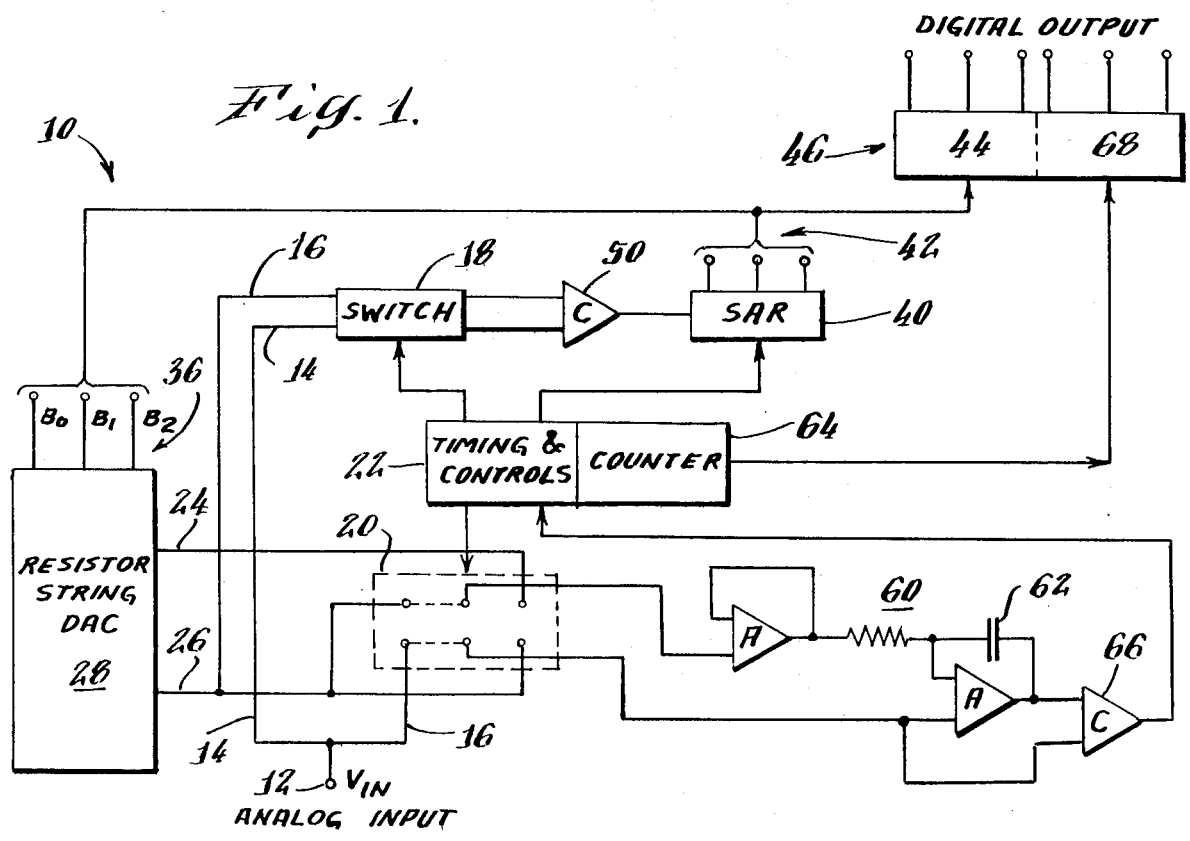
FIG. 1 is a circuit diagram, partly in block format, showing a two-stage analog-to-digital converter in accordance with the invention.

Referring now to FIG. 1, an analog-to-digital converter 10 in accordance with the invention includes an input terminal 12 to receive the analog input signal $V_{in}$. This signal is connected by leads 14 and 16 to respective switches 18 and 20 which as will be explained are operated in sequence during a conversion, as by a Timing & Controls Unit utilizing conventional timing devices, and generally indicated at 22. Also connected to switches 18 and 20 are the output leads 24, 26 of a resistorstring d-to-a converter shown in block format at 28 and forming a basic component of the first stage of the analog-to-digital converter.

Figure 2:
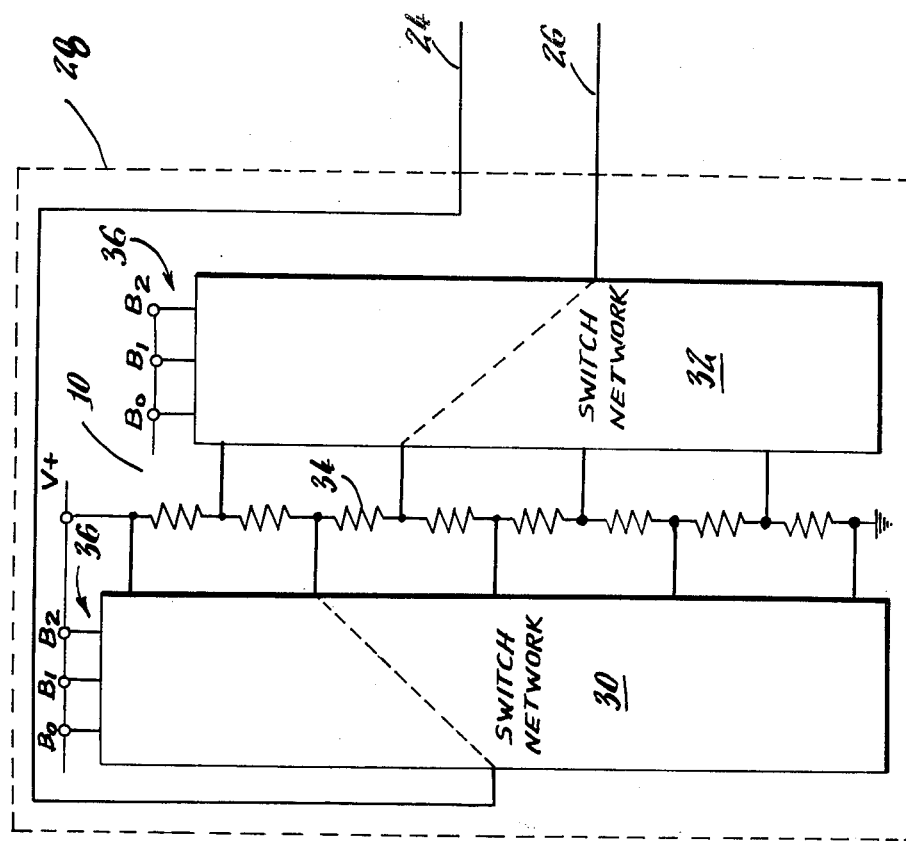
FIG. 2 is a circuit diagram, partly in block format, showing a resistor-string d-to-a converter adapted for use in an analog-to-digital converter of the type shown in FIG. 1.

The circuit of the d-to-a converter 28 is shown in FIG. 2, where it will be seen that the converter output leads 24, 26 are selectively connected by identical switch networks 30, 32 to respective end terminals of any one of the string resistors, such as illustrated at 34. The resistor selected is determined by a digital input signal applied to digital input terminals 36. The converter 28 is illustrated herein in simplified form, having a digital input of only 3 bits represented as B0, B1 and B2.

The analog-to-digital conversion procedure includes two sequential phases: (1) a successive-approximation phase to determine a set of higher-order bits, and (2) a dual-slope integration phase to determine the remaining, less significant bits. The conversion operation begins when the Timing & Controls (T & C) Unit 22 starts the successive-approximation phase by closing the switch 18 and directing a start control signal to a successive-approximation register (SAR) generally indicated at 40. The output lines 42 of the SAR connect to the digital input terminals 36 of the d-to-a converter 28, and also to one section 44 of an output register 46.

The SAR 40 first is set by the start control signal from T & C Unit 22 to produce a digital signal which causes an output from converter 28 of one-half of full scale, i.e. corresponding to a digital input with the first bit B0 equal to a binary "1". The switch 18 directs the output of the d-to-a converter, together with the analog input signal $V_{in}$, to a comparator 50 which compares the two voltages to determine whether $V_{in}$ is above or below the d-to-a converter output level. The result of this comparision is applied as a logic signal to the SAR wherein the usual logic circuitry correspondingly alters the digital signal being fed to the converter 28.

In accordance with well-known techniques, the logic circuitry of the SAR 40 is sequenced through a program of decisionmaking steps until the digital input to the converter 28 produces on output leads 24, 26 respective voltages the values of which bracket the analog input signal level $V_{in}$. That is, the switch networks 30, 32 will select a resistor 34 having end junction voltages which are respectively above and below $V_{in}$ (unless of course $V_{in}$ is equal to one of the junction voltages, in which case that junction voltage will be connected to converter output lead 26).

The digital input signal on terminals 36 of the converter 28 thus is developed to represent the higher-order bits of the final digital output signal. These higher-order bits are applied to section 44 of the output register 46. The next and final step is to determine the remaining lower-order bits of the digital output signal.

For that purpose, the Timing & Controls Unit 22 thereafter initiates the second phase of conversion by deactivating (opening) the switch 18 and producing a control signal to close switch 20, so as to complete connections to its left-hand poles (as shown). This connects to the input of a conventional dual-slope integrating-type analog-to-digital converter, generally indicated at 60, a voltage representing the difference between the analog input $V_{in}$ and the voltage on the lower output line 26. (Note: The voltage on line 26 is the analog signal correspo.dinng to the digital signal B0, B1, B2 applied to the converter 28.) The dual-slope converter 60 integrates this difference voltage for a pre-set time period (e.g. typically 1024 pulses of a timing clock signal developed by the Timing & Controls Unit 22). At the end of this integration period, the magnitude of the integrated voltage on integrator capacitor 62 will be proportional to the applied signal level, which in this case corresponds to the difference between the analog input $V_{in}$ and the output voltage of the d-to-a converter 28.

After this pre-set signal-integration period, the switch 20 is shifted(by T & C Unit 22) to its right-hand poles to effect a reverse-polarity integration of a reference signal developed as the voltage between lines 24 and 26, i.e. the voltage across the selected string resistor 34. By this reverse-polarity integration, the integrator capacitor voltage is returned to its initial datum level at a rate determined by the magnitude of the reference signal, i.e. by the voltage across the selected resistor 34. A counter 64 operable by the T & C Unit 22 counts the number of timing clock pulses developed during this reverse-polarity integration.

A comparator 66 detects the return of the integrator voltage to the datum level, and stops the counter 64 at that time. The pulse count then stored in the counter represents, as a percentage of the initial pre-set pulse time period of integration, the interpolation of the analog input signal $V_{in}$ within the range of voltages appearing on lines 24 and 26, as determined by the voltage across the resistor 34 selected by operation of the SAR 40. This stored pulse count is directed to the output register 46 which (by conventional means, not shown) converts the number of stored pulses to a corresponding binary digital number stored in a second section 68 of the output register 46, and representing the remaining, less-significant bits of the output signal. Thus the combination of the digital signals in register sections 44 and 68 provides the complete digital output signal corresponding to $V_{in}$.

As noted above, the digital signal represented by the number of pulses in the counter 64 in effect provides an interpolation between the output of the d-to-a converter 28 (the voltage on line 26) and the next higher analog level of that converter (the voltage on line 24). It will be seen that this interpolation possesses inherent accuracy because the reference voltage applied to the dual-slope integrator 60 is the actual step voltage next above the output level of the converter 28. By using this technique, moreover, the overall conversion can be carried out very rapidly.

Figure 3:
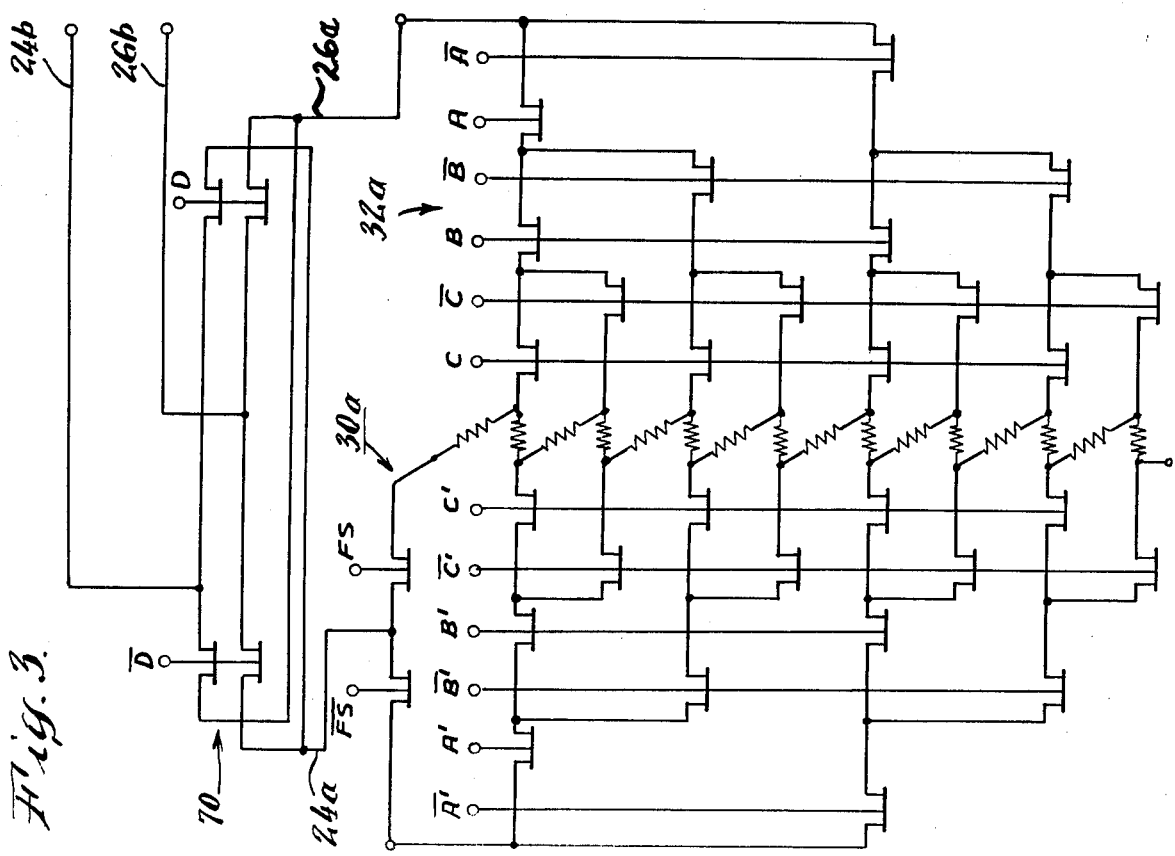
FIG. 3 is a circuit diagram showing details of the switch networks of a resistor-string d-to-a converter like that of FIG. 2.

FIG. 3 presents circuit details of switching networks for a d-to-a converter of the resistor-string type. This particular embodiment accepts a four-bit digital signal for controlling the connection to the string of resistors (sixteen in number). It will be understood, however, that the general principle is applicable to converters of higher resolution.

The switch networks 30a, 32a are so arranged that when the digital signal changes to alter the selected voltage by one full analog step, one of the voltages on network output leads 24a, 26a is unchanged, and the other lead voltage changes by two full steps, thus "leap frogging" the first (unchanged) lead voltage. Accordingly, the voltage between the two network leads 24a, 24b will be reversed in polarity.

To restore the correct polarity of the voltage difference, a reversing switch 70 is operated by the fourth bit to reverse the connections from the resistor junctions to the output lines 24b, 26b. This reversal restores the original condition whereby one lead from the converter always is positive relative to the other lead. The combination of logic-controlled switch networks 30a, 32a, and the reversing switch 70 uses fewer costly parts than conventional switch networks for achieving the same final result.

Figure 4:
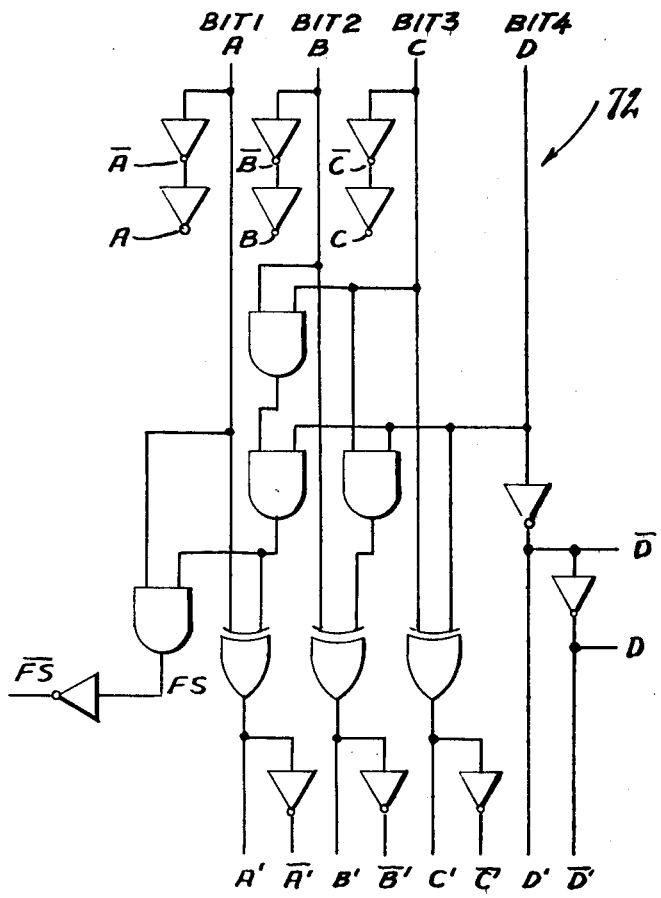
FIG. 4 illustrates logic decode circuitry for the switch networks of FIG. 3.

All of the switches of the networks 30a, 32a are illustrated as MOS-type devices, and the reversing switch 70 similarly comprises MOS-type devices. The switch control terminals are labelled with the corresponding logic signal identifiers such as A, $\overline{A}$, etc. The details of suitable logic circuitry 72 for developing these logic signals are shown in FIG. 4.

Although specific embodiments of the invention have been disclosed herein in detail, it is to be understood that this is for the purpose of illustrating the invention and should not be construed as necessarily limiting the scope of the invention, since it is apparent that many changes can be made to the disclosed embodiment by those skilled in the art to suit particular applications.

I claim:

1. An anolog-to-digital converter including first and second stages which are operable sequentially to produce, respectively, a first set of higher-order bits and a second set of lower-order bits together constituting a digital output signal corresponding to an anolog input signal, comprising:
    (A) a resistor-string segment-type d-to-a converter forming part of said first stage and operable in response to a digital input signal to produce on an output line any one of a group of discrete, progressively differing analog signal levels as developed at the nodes connecting the common ends of the resistors of said resistor string;
    the resistors of said string having values which are nominally equal, but which actually vary somewhat due to manufacturing tolerances so that the voltages across the resistors also are correspondingly unequal;
    control circuit means responsive both to said analog input signal and the analog signal level on said output line, said control circuit means being operable in a first phase of an analog-to-digital conversion operation to compare said analog input signal and said output line signal level and to develop a digital input signal for said d-to-a converter setting said output line signal at one of said levels which is next to the value of said analog input signal, said digital input signal serving as said first set of high-erorder bits;

said first stage further including means to produce a reference signal representing the difference between (i) said analog output signal from one of said resistor-string nodes and (ii) the next one of said discrete analog signal levels from the node next adjacent said one node and which together with said analog output signal brackets the value of said analog input signal;

the magnitude of said difference signal depending upon the selected pair of nodes from which it is derived, due to said variation in resistor voltage resulting from said manufacturing tolerances; and (B) an a-to-d converter of the multi-slope integrating type forming part of said second stage and including analog input terminal means and reference signal terminal means;

said control circuit means serving in a second phase of the analog-to-digital conversion operation to direct to said input terminal means a signal corresponding to the difference between (a) said analog input signal and (b) one of said two discrete analog signal levels which together define said difference signal and to direct said difference signal to said reference terminal means, said control circuit means further serving in said second phase to operate said integrating-type a-to-d converter to develop said set of lower-order bits providing an interpolation of said analog input signal between said analog output signal and the next one of said discrete analog signal levels which together define said difference signal;

said control circuit means further including means to operate said multi-slope converter with said analog input signal and said difference signal being integrated in predetermined sequence to provide that at least one integration time, as represented by clock pulses, affords a numeric measure of said interpolation of said analog input signal between said two levels for developing said lower-order bits.

* * * * *